United States Patent [19]

Bennett

[11] Patent Number: 4,642,578

[45] Date of Patent: Feb. 10, 1987

[54] PUSH-PULL RADIO FREQUENCY CIRCUIT WITH INTEGRAL TRANSISTION TO WAVEGUIDE OUTPUT

[76] Inventor: Wilfred P. Bennett, 21 Catskill Ct., Belle Mead, N.J. 08502

[21] Appl. No.: 832,790

[22] Filed: Feb. 26, 1986

[51] Int. Cl.[4] ................................................ H03B 5/18

[52] U.S. Cl. ........................................ 331/100; 331/96; 333/254; 333/260

[58] Field of Search .......................... 331/96, 100, 102; 330/55; 333/254, 260

[56] References Cited

U.S. PATENT DOCUMENTS

| | | | |
|---|---|---|---|
| 2,247,779 | 7/1941 | Keister | 330/55 |
| 2,370,423 | 2/1945 | Roberts | 331/100 X |
| 2,404,188 | 7/1946 | Phillips | 330/55 X |

*Primary Examiner*—Siegfried H. Grimm

*Attorney, Agent, or Firm*—Judson R. Hightower; Richard E. Constant

[57] ABSTRACT

A radio frequency circuit for ICRF heating includes a resonant push-pull circuit, a double ridged rectangular waveguide, and a coupling transition which joins the waveguide to the resonant circuit. The resonant circuit includes two cylindrical conductors mounted side by side and two power vacuum tubes attached to respective ends of a cylindrical conductor. A conductive yoke is located at the other end of the cylindrical conductors to short circuit the two cylindrical conductors. The coupling transition includes two relatively flat rectangular conductors extending perpendicular to the longitudinal axes of a respective cylindrical conductor to which the flat conductor is attached intermediate the ends thereof. Conductive side covers and end covers are also provided for forming pockets in the waveguide into which the flat conductors extend when the waveguide is attached to a shielding enclosure surrounding the resonant circuit.

5 Claims, 2 Drawing Figures

PUSH-PULL RADIO FREQUENCY CIRCUIT WITH INTEGRAL TRANSISTION TO WAVEGUIDE OUTPUT

FIELD OF THE INVENTION

The present invention relates generally to a radio frequency circuit, and more particularly to a push-pull circuit with an integral transition to a waveguide output terminal.

BACKGROUND OF THE INVENTION

ICRF heating of a plasma in a tokamak or similar fusion machine requires a means of generating and transmitting high levels of radio transmission power to the fusion machine. In proposed Q=1 or greater large scale fusion reactors, projected power requirements of 40 MW of ICRF heating are needed. Currently, in order to produce such power, a number of power vacuum tubes using coaxial cables for transmission must be combined, with the resultant inefficiencies thereof.

SUMMARY OF THE INVENTION

In accordance with the present invention, a radio frequency circuit having an operating frequency of approximately 80 MHz is provided. The circuit comprises a resonant circuit, a double ridged rectangular waveguide, and a coupling transition between the waveguide and the resonant circuit. The resonant circuit includes two cylindrical conductors, two power vacuum tubes connected to a respective cylindrical conductor, a ground plane to which the vacuum tubes are mounted, and a conductive yoke located at the opposite ends of the cylindrical conductors from the power vacuum tubes. The coupling transition includes two relatively flat rectangular conductors attached to a respective cylindrical conductor and extending perpendicular thereto and parallel to one another. The recesses alongside the waveguide are formed into pockets having an open proximal end by suitable side covers and end covers. A suitable shielding enclosure surrounds the resonant circuit and has an opening through which the flat conductors extend and about which the proximal end of the waveguide is attached so that the respective flat conductors are received in a respective pocket of the waveguide and terminate in an open circuit.

Preferably, the flat conductors are attached to a respective cylindrical conductor in a position where a suitable impedance transformation at resonance occurs between the waveguide and the vacuum tubes. In addition, the distance of the yoke from the external terminals of the vacuum tubes is preferably one half wavelength. The distance from the internal elements of the vacuum tubes is electrically three fourths wavelength.

It is an advantage of the present invention that a waveguide output is connected directly to the source of power. In some designs, where a coaxial line is used to transmit power from source to machine, a waveguide coupler is still required to transfer power to the plasma in the machine.

It is also an advantage of the present invention that the source output circuit which feeds the waveguide is a push-pull circuit employing two power vacuum tubes. Thus, the output of two tubes is combined without requiring a separate combining network as would be the case with single tube amplifier sources needed to achieve the equivalent power level.

Still another advantage of the present invention is that the push-pull circuit provides an inherent reduction in the second harmonic output power as compared to single tube circuits.

Other features and advantages of the present invention are stated in or apparent from a detailed description of a presently preferred embodiment of the invention found hereinbelow.

DETAILED DESCRIPTION OF THE PREFERRED EMBODIMENT

Figure 1:
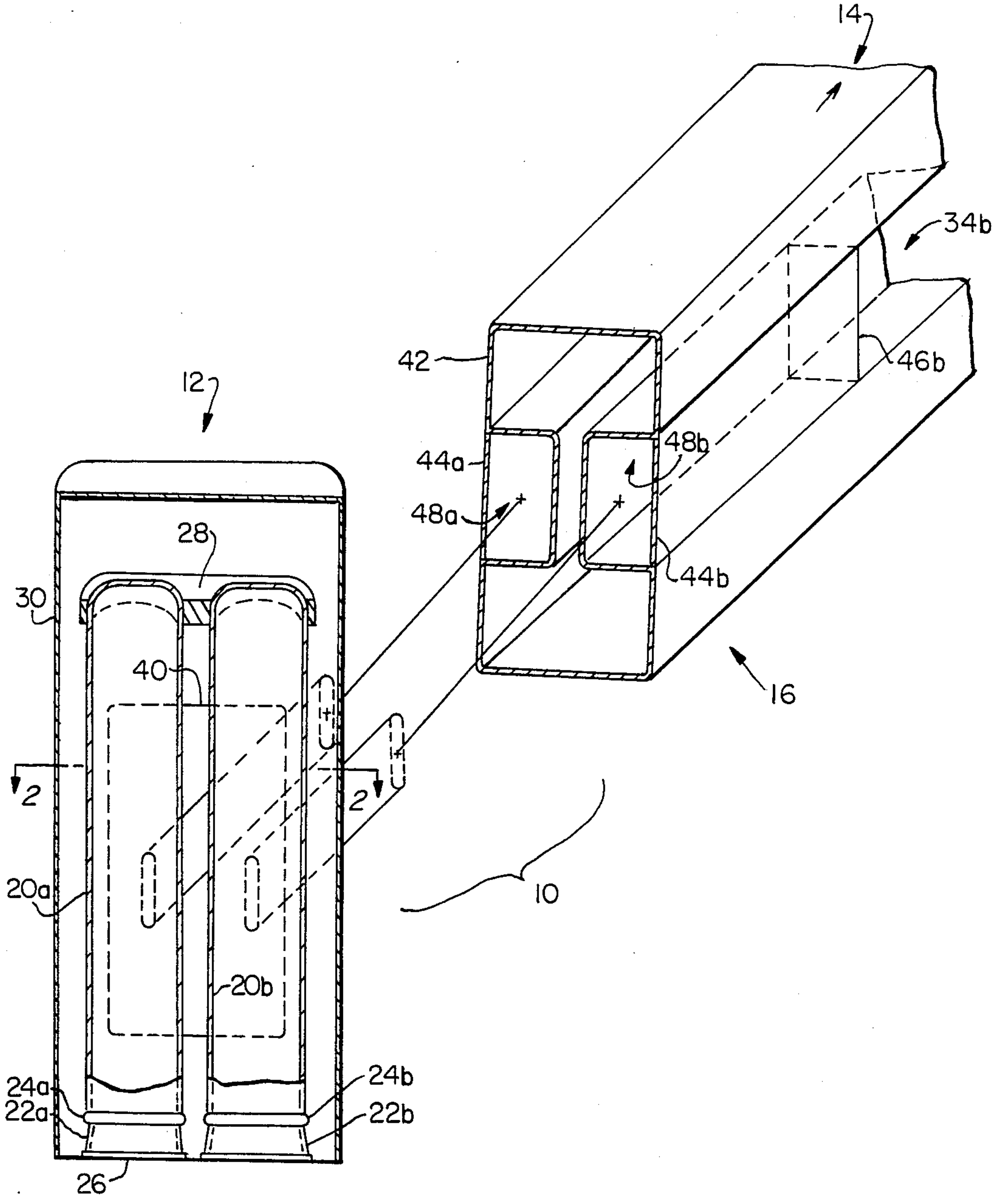
FIG. 1 is a partially cut away exploded elevational perspective view of the radio frequency circuit of the present invention.
Figure 2:
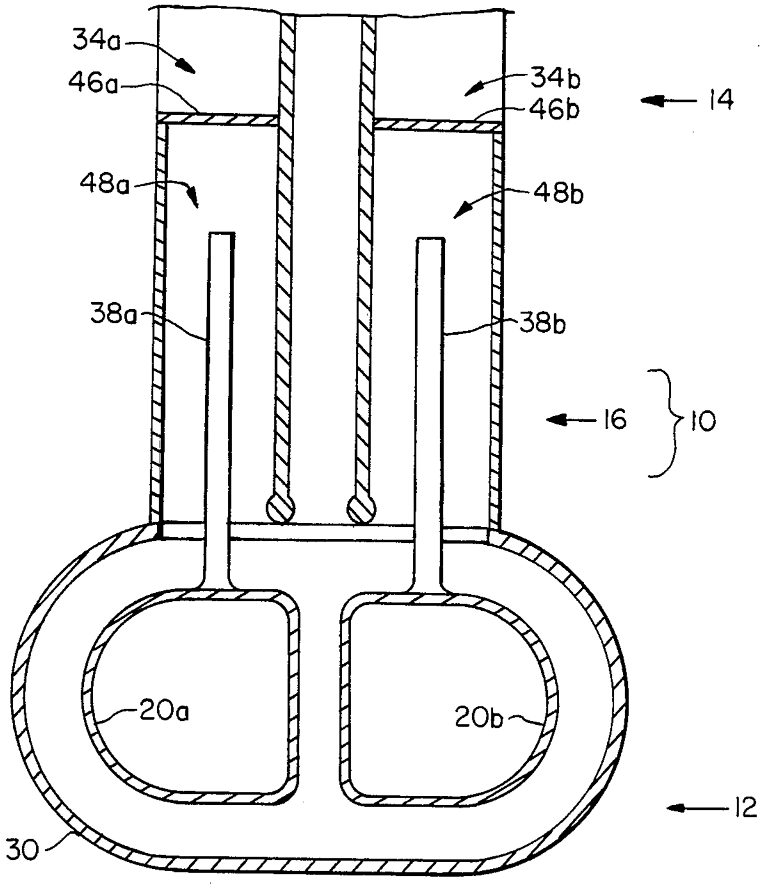
FIG. 2 is a top cross-sectional view of the radio frequency circuit depicted in FIG. 1 taken along the line 2—2 in FIG. 1.

With reference now to the drawings in which like numerals represent like elements throughout the several views, a radio frequency circuit 10 is depicted in FIGS. 1 and 2. Radio frequency circuit 10 includes a resonant circuit 12, a waveguide 14, and a coupling transition 16. Radio frequency circuit 10 is sized for use at an operating frequency of approximately 80 MHz.

Resonant circuit 12 includes two cylindrical conductors **20*a* and 20*b* mounted in a parallel alignment. Located at one end of each of the cylindrical conductors 20*a* and 20*b* is a respective power vacuum tube 22*a* and 22*b*. Each cylindrical conductor 20*a* and 20*b* is connected to a respective anode 24*a* and 24*b* of power vacuum tubes 22*a* and 22*b*. Both power vacuum tubes 22*a* and 22*b* are mounted from a common ground plane 26**.

At a physical distance of approximately two meters (one-half wavelength) from vacuum tubes **22*a* and 22*b*, cylindrical conductors 20*a* and 20*b* are connected together by a conductive yoke 28. Yoke 28 effectively places a short circuit across cylindrical conductors 20*a* and 20*b* at a point which is electrically three-quarters of a wavelength from the internal structure of power vacuum tubes 22*a* and 22*b*. To prevent excessive radiation and limit access to cylindrical conductors 20*a* and 20*b* at high DC voltages, resonant circuit 12 is mounted inside a metallic shielding enclosure 30 which is connected to ground plane 26**.

As shown in FIG. 1, waveguide 14 is a double ridged rectangular waveguide having recesses **34*a* and 34*b*. Waveguide 14 transmits the power produced by radio frequency circuit 10** to the energy consuming load in the direction indicated by the arrow.

Coupling transition 16 which joins waveguide 14 to resonant circuit 12 includes two relatively flat, elongate, rectangular conductors **38*a* and 38*b*. As shown in the drawings, the flat conductors 38*a* and 38*b* are respectively attached to a respective cylindrical conductor 20*a* and 20*b* at an appropriate point along the axial dimension thereof. This point is selected to provide a suitable impedance transformation, at resonance, between the rectangular output waveguide 14 and vacuum tubes 22*a* and 22*b*. Flat conductors 38*a* and 38*b* extend perpendicular to the respective cylindrical conductors 20*a* and 20*b* and are parallel to one another. In addition, the major lateral axis of a respective flat conductor 38*a* or 38*b* is parallel to a respective longitudinal axis of a respective cylindrical conductor 20*a* or 20*b*. Flat conductors 38*a* and 38*b*** extend through an aperture 40 provided in shielding enclosure 30. Aperture 40 is sized the same as the rectangular cross-section of waveguide 14 as will be further explained subsequently.

Each recess 34*a* and 34*b* of waveguide 14 adjacent end 42 of waveguide 14 is covered for a short length by a suitable conductive cover 44*a* or 44*b*, respectively. In addition, at the end of conductive covers 44*a* or 44*b* distal from end 42 of waveguide 14, a respective conductive plate 46*a* or 46*b* extends laterally in respective recess 34*a* or 34*b* to form a closed end. With this construction, recesses 34*a* and 34*b* adjacent end 42 of waveguide 14 are formed into pockets 48*a* and 48*b*.

As mentioned above, aperture 40 is sized to be the same as the rectangular cross section of waveguide 14. With this construction, waveguide 14 including conductive covers 44*a* and 44*b* forms a rectangular structure which is suitably attached about aperture 40. When so attached, flat conductors 38*a* and 38*b* extend into respective pockets 48*a* and 48*b*, but do not touch the walls of pockets 48*a* or 48*b*. Flat conductors 38*a* and 38*b* project along waveguide 14 for an overlap distance equal to a quarter wavelength. As flat conductors 38*a* and 38*b* are spaced from respective conductive end plates 46*a* and 46*b* as shown in FIG. 2, flat conductors 38*a* and 38*b* terminate in an open circuit.

During operation, the two projecting flat conductors 38*a* and 38*b*, being attached to respective cylindrical conductors 20*a* and 20*b* which are in turn connected directly to respective anodes 24*a* and 24*b*, are at a high DC voltage. Shielding enclosure 30 and the waveguide 14 attached thereto are at ground or a low DC voltage.

Flat conductors 38*a* and 38*b*, which form a parallel strip transmission line, serve to transmit the RF power in cylindrical conductors 20*a* and 20*b* from resonant circuit 12 into waveguide 14. This is done without the need of a continuing DC current path to waveguide 14, so that the necessary DC isolation is provided between resonant circuit 12 and the remaining parts of radio frequency circuit 10 which are at DC ground potential. Because flat conductors 38*a* and 38*b* overlap waveguide 14 by one quarter wavelength and are open circuited at the far end, a short circuit, low impedance point is presented at the location where flat conductor 38*a* and 38*b* first interface with waveguide 14. This forms a suitable low loss path for the transmission of power into waveguide 14. Coupling transition 16 also performs the function of blocking direct current voltages from the output line or at waveguide 14.

It should be appreciated that power vacuum tubes 22*a* and 22*b* can be a tetrode or triode type source. In addition, it will also be understood that the push-pull operation of resonant circuit 12 suppresses certain harmonic outputs.

It should further be appreciated that a number of radio frequency circuits as described above can be combined to produce a device with an even greater output. Such a device would have one-half of the combiners as compared to a single coaxial cable to waveguide system employing combiners to achieve the same power output.

Besides use as a means for generating and transmitting high levels of radio frequency power to fusion machines, the present invention also has potential use in large particle accelerators and in commercial high power RF industrial heating applications.

Although the present invention has been described with respect to an exemplary embodiment thereof, it will be understood by those of ordinary skill in the art that variations and modifications can be effected within the scope and spirit of the invention.

I claim:

1. A radio frequency, circuit comprising:

a resonant push-pull circuit which produces a radio frequency signal having a predetermined wavelength, said push-pull circuit including (a) two cylindrical conductors mounted side by side and in parallel alignment having first and second ends, (b) two power vacuum tubes, each said vacuum tube having a respective anode to which the first end of a respective said cylindrical conductor is connected, (c) a ground plane to which said vacuum tubes are mounted, and (d) a conductive yoke located at the second ends of said cylindrical conductors which provides short circuiting of said two cylindrical conductors;

a double ridged rectangular waveguide, having recesses along the length thereof and a proximal end located adjacent said resonant circuit, for transmitting the power produced by said resonant circuit; and a coupling transition which joins said waveguide to said resonant circuit including (a) two relatively flat, elongate, rectangular conductors, a respective said flat conductor having one end attached to a respective said cylindrical conductor intermediate the ends of the respective said cylindrical conductor such that the longitudinal axes of said flat conductors are parallel, the longitudinal axis of a respective said flat conductor extends perpendicular to the longitudinal axis of a respective cylindrical conductor, and the major lateral axis of a respective said flat conductor is parallel to the longitudinal axis of a respective said cylindrical conductor, (b) two conductive side covers, respective ones of said side covers being attached along a respective external recess of said rectangular waveguide starting at the proxixal end of said waveguide to form a pair of elongate pockets in the recesses, (c) two conductive end covers, respective ones of said end covers being attached to respective ends of said side covers distal from the proximal end of said waveguide and to the periphery of the respective recess to form respective closed ends in said pockets, and (d) a shielding enclosure surrounding said resonant circuit, said enclosure having an opening through which said flat conductors extend and about which the proximal end of said waveguide is attached such that respective said flat conductors are received in respective pockets in said waveguide and terminate in an open circuit.

2. A radio frequency circuit as claimed in claim 1 wherein said flat conductors are attached to a respective said cylindrical conductor at a position where a suitable impedance transformation occurs at resonance between said waveguide and said vacuum tubes.

3. A radio frequency circuit as claimed in claim 1 wherein said yoke is located at a physical distance from external terminals of said vacuum tubes of about one-half wavelength at the operating frequency of said resonant circuit and at an electrial distance from said yoke to internal elements of said vacuum tubes of about three fourths wavelength.

4. A radio frequency circuit as claimed in claim 1 wherein said flat conductors extend into respective said pockets for a distance equal to about one-fourth wavelength at the operating frequency of said resonant circuit.

5. A radio frequency circuit as claimed in claim 1 wherein said ground plane is connected to said shielding enclosure.

* * * * *